US008723619B2

(12) United States Patent
Weiß

(10) Patent No.: US 8,723,619 B2
(45) Date of Patent: May 13, 2014

(54) FILTER ARRANGEMENT HAVING FIRST AND SECOND DUPLEX FILTERS

(75) Inventor: Holger Weiß, Sontheim (DE)

(73) Assignee: Kathrein-Werke KG, Rosenheim (DE)

( * ) Notice: Subject to any disclaimer, the term of this patent is extended or adjusted under 35 U.S.C. 154(b) by 590 days.

(21) Appl. No.: 13/044,026

(22) Filed: Mar. 9, 2011

(65) Prior Publication Data

US 2012/0230227 A1    Sep. 13, 2012

(51) Int. Cl.
| | |
|---|---|
| *H03H 7/46* | (2006.01) |
| *H01P 5/12* | (2006.01) |
| *H01P 5/16* | (2006.01) |
| *H04B 1/50* | (2006.01) |
| *H03H 9/70* | (2006.01) |

(52) U.S. Cl.
CPC ................ H03H 7/463 (2013.01); H04B 1/50 (2013.01); H01P 5/12 (2013.01); H01P 5/16 (2013.01); *H03H 9/703* (2013.01)
USPC ........... 333/132; 333/117; 333/126; 333/129; 333/133; 455/78; 455/82; 455/83

(58) Field of Classification Search
USPC ......... 333/117, 120, 121, 126, 129, 132, 133; 455/63.1, 73, 78, 80, 82, 83
See application file for complete search history.

(56) References Cited

U.S. PATENT DOCUMENTS

| | | | | |
|---|---|---|---|---|
| 7,821,355 | B2 * | 10/2010 | Engel | 333/117 |
| 8,364,092 | B2 * | 1/2013 | Kouki et al. | 455/80 |
| 2003/0048153 | A1 * | 3/2003 | Liang et al. | 333/132 |
| 2003/0076194 | A1 * | 4/2003 | Machui | 333/133 |
| 2003/0139198 | A1 * | 7/2003 | Johannisson et al. | 455/525 |
| 2005/0218753 | A1 * | 10/2005 | Nakatsuka et al. | 310/324 |
| 2007/0015468 | A1 * | 1/2007 | Kouki et al. | 455/63.1 |
| 2013/0234806 | A1 * | 9/2013 | Schmidhammer et al. | 333/133 |

FOREIGN PATENT DOCUMENTS

DE    10 2010 046 677 A1 * 3/2012

OTHER PUBLICATIONS

A.M. Elzayat et al.; "Tx/Rx Isolation Enhancement Based on a Novel Balanced Duplexer Architecture"; 2011 IEEE MTT-S International Microwave Symposium Digest, Jun. 5-10, 2011, pp. 1-4 and IEEE abstract page.*

* cited by examiner

*Primary Examiner* — Barbara Summons
(74) *Attorney, Agent, or Firm* — Stephen H. Eland; Dann, Dorfman, Herrell & Skillman

(57) ABSTRACT

A filter arrangement for filtering a radio transmit signal and radio receive signal, comprising a first duplex filter and a second duplex filter, a signal divider for splitting a transmit input signal into a first transmitter signal portion and a second transmitter signal portion, the first transmitter signal portion being passed to the a transmit port of the first duplex-filter, and a second signal portion being passed to the second transmitter port of the second duplex filter. The filter arrangement further comprising a signal combiner/divider for combining a first filtered transmit portion signal and a second filtered transmit portion signal into a single filtered transmit signal. The filter arrangement further comprising a signal combiner for combining a first filtered receive signal portion and a second filtered receive signal portion into a single filtered receive signal, which is provided at a third output of the signal combiner. With such a filter arrangement the suppression of noise from the transmit signal in the receive signal is improved.

9 Claims, 5 Drawing Sheets

FILTER ARRANGEMENT HAVING FIRST AND SECOND DUPLEX FILTERS

FIELD OF THE INVENTION

The field of the present application relates in general to a filter arrangement and in particular to a radio station with a filter arrangement. The field of the application also relates to a method of manufacturing a filter arrangement.

BACKGROUND OF THE INVENTION

Filters are designed, for example, for a specific frequency band. Signals within that specific frequency band will pass through the filter from a first port to a second port whereas signals outside of the specific frequency band will be prevented from passing through the filter. The filters may be produced as a combination of resistors, inductors, and capacitors or as ceramic filters, such as but no limited to surface acoustic wave filters or film bulk acoustic resonators. Dependent on their technology each filter may be distinguishable from other filters by electrical characteristics such as insertion loss, out-band signal rejection, electric power durability, as well as in size and price.

A special application of the filters is a duplex filter for radio transceivers. A duplex filter enables a transmitter and a receiver to share a single antenna, by preventing a transmission signal from entering the receiver and, likewise, the received signal from entering the transmitter. The duplex filter usually comprises two separate band-pass filters, one of which is connected to the receiver section of the transceiver, and the other filter is connected to the transmitter section of the transceiver. Duplex filter designs are commercially available as off-the-shelf filters for a plurality of different circuit designs for the transceiver. However, the technical properties of these off-the-shelf filters may not always meet the design criteria a circuit designer has in mind when designing a radio station.

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price. As the size and price of radio stations goes down, there is a need to provide, smaller and less expensive filters and duplex filters.

SUMMARY OF THE INVENTION

It is an aspect of the teachings of the present disclosure to provide a filter arrangement for filtering a radio transmit signal and radio receive signal, comprising a first duplex filter, the first duplex filter comprising a first transmitter port, a first receiver port, and a first antenna port, and further comprising a second duplex filter, the second duplex filter comprising a second transmitter port, a second receiver port, and a second antenna port. The filter arrangement further comprises a signal divider for splitting a transmit input signal into a first transmitter signal portion and a second transmitter signal portion, the first transmitter signal portion being passed to the first transmit port of the first duplex filter, and the second transmitter signal portion being passed to the second transmitter port of the second duplex filter. The filter arrangement further comprises a signal combiner/divider with a first signal/combiner port, connected to the first antenna port of the first duplex filter, and a second signal/combiner port, connected to the second antenna port of the second duplex-filter, the signal combiner/divider combining a first filtered transmit portion signal and a second filtered transmit portion signal into a single filtered transmit signal, which is provided at a third signal/combiner port of the signal combiner/divider, and for splitting the radio receive signal received at the third combiner/divider port into a first receive signal portion and a second receive signal portion, the first receive signal portion being provided at the first signal combiner/divider port and the second signal portion being provided at the second signal combiner/divider port. The filter arrangement further comprises a signal combiner with a first signal combiner input, connected to the first receive port of the first duplex filter, and with a second signal combiner port of the second duplex filter, connected to the second receive port of the second duplex filter, the signal combiner combining a first filtered receive signal portion and a second filtered receive signal portion into a single filtered receive signal, which is provided at a third output of the signal combiner. This filter arrangement enables the improvement of the transmit signal to receive signal isolation compared to a single duplex filter.

Another aspect of the teachings of the present disclosure is that at least one of the signal combiner, the signal divider or the signal divider/combiner is a 90° coupler.

Another aspect of the teachings of the present disclosure is that at least one of the first duplex filter or the first duplex filter is at least one of a bulk acoustic resonator filter (FBAR), a surface acoustic wave device, a bulk acoustic wave device, a ceramic filter or a cavity filter.

Another aspect of the teachings of the present disclosure is a filter arrangement for filtering a radio receive signal, comprising a first duplex filter, the first duplex filter comprising a first transmitter port, a first receiver port, and a first antenna port and further comprising a second duplex filter, the second duplex filter comprising a second transmitter port, a second receiver port, and a second antenna port. The filter arrangement further comprises a signal combiner/divider with a first signal/combiner port, connected to the first antenna port of the first duplex filter, and with a second signal/combiner port, connected to the second antenna port of the second duplex-filter, the signal combiner/divider combining a first filtered transmit portion signal and a second filtered transmit portion signal into a single filtered transmit signal, which is provided at a third signal/combiner port of the signal combiner/divider, and for splitting the radio receive signal received at the third combiner/divider port into a first receive signal portion and a second receive signal portion, the first receive signal portion being provided at the first signal combiner/divider port and the second signal portion being provided at the second signal combiner/divider port. The filter arrangement further comprises a signal combiner with a first signal combiner input, connected to the first receive port of the first duplex-filter, and with a second signal combiner port, connected to the second receive port of the second duplex-filter, for combining a first filtered receive signal portion and a second filtered receive signal portion into a single filtered receive signal, which is provided at a third output of the signal combiner. The filter arrangement further comprises at least a first amplifier with at least a first amplifier output connected to the first transmit port of the first duplex filter and a compensation controller providing at least a first amplifier control signal to control at least one of an amplifying gain or a phase shift, wherein the compensation controller generates the first amplifier control signal in dependence of a signal provided at a fourth divider/combiner port of the divider/combiner.

Another aspect of the teachings of the present disclosure is further providing a second amplifier, wherein the second amplifier is connected with a second amplifier output to the second transmit port of the second duplex filter. A first noise signal and a second noise signal can be controlled independently of each other with the second amplifier. Thereby the output level of the second amplifier can be held substantially constant.

Another aspect of the teachings of the present disclosure is the filter arrangement further comprising a signal divider for splitting a transmit input signal into a first transmitter signal portion and a second transmitter signal portion, the first transmitter signal portion being passed to a first amplifier input of the first amplifier, and the second signal portion being passed to a second amplifier input of the second amplifier.

Another aspect of the teaching of the present disclosure is that the transmit signal splitter is incorporated in the compensation controller and the first transmit signal portion is derived from the transmitter signal by electronically applying a 180° phase delay to the transmitter signal and the second transmitter signal portion is derived from the transmitter signal by electronically applying a 90° phase delay to the transmitter signal. The electronically generated phase shift of the first transmitter signal portion and the second transmitter signal portion are provided in order to compensate the phase shift that will be applied by the signal divider/combiner to the first transmitter signal portion and the second transmitter signal portion. As the compensation controller has to adopt the gain/phase of the first transmitter signal portion and the second transmitter signal portion it can be used at the same time to generate the phase delay of the first transmitter portion signal and the second transmitter portion signal so that a signal splitter becomes obsolete. As the generation of electronically phase-delayed signals does not need any extra space on the circuit board, the advantage of this arrangement is that it saves the space of the obsolete signal splitter on the circuit board.

Another aspect of the teachings of the present disclosure is a method of manufacturing a filter arrangement for filtering a radio signal by connecting a first signal divider output of a signal divider to a first transmit port of a first duplex filter; connecting a second signal divider output to a second transmitter port of a second duplex filter (connecting a first antenna port of the first duplex filter to a first signal/combiner port of a signal combiner/divider; connecting a second antenna port of the second duplex-filter to a second signal/combiner port of the signal combiner/divider; connecting a first signal combiner input of a signal combiner to a first receive port of the first duplex-filter; and connecting a second signal combiner port of the signal combiner to a second receive port of the second duplex-filter.

Another aspect of the teachings of the present disclosure is a computer program product comprising a non-transitory computer-usable medium having control logic stored therein for causing a computer to manufacture a filter arrangement for filtering a radio transmit signal and radio receive signal, comprising a first duplex filter, the first duplex filter comprising a first transmitter port, a first receiver port, and a first antenna port and further comprising a second duplex filter, the second duplex filter comprising a second transmitter port, a second receiver port, and a second antenna port. The filter arrangement further comprises a signal divider for splitting a transmit input signal into a first transmitter signal portion and a second transmitter signal portion, the first transmitter signal portion being passed to the first transmit port of the first duplex filter, and the second signal portion being passed to the second transmitter port of the second duplex filter. The filter arrangement further comprises a signal combiner/divider with a first signal/combiner port, connected to the first antenna port of the first duplex filter, and a second signal/combiner port, connected to the second antenna port of the second duplex-filter, the signal combiner/divider combining a first filtered transmit portion signal and a second filtered transmit portion signal into a single filtered transmit signal, which is provided at a third signal/combiner port of the signal combiner/divider, and for splitting the radio receive signal received at the third combiner/divider port into a first receive signal portion and a second receive signal portion, the first receive signal portion being provided at the first signal combiner/divider port and the second signal portion being provided at the second signal combiner/divider port. The filter arrangement further comprises a signal combiner with a first signal combiner input, connected to the first receive port of the first duplex-filter, and with a second signal combiner port of the second duplex-filter, connected to the second receive port of the second duplex-filter, the signal combiner combining a first filtered receive signal portion and a second filtered receive signal portion into a single filtered receive signal, which is provided at a third output of the signal combiner.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
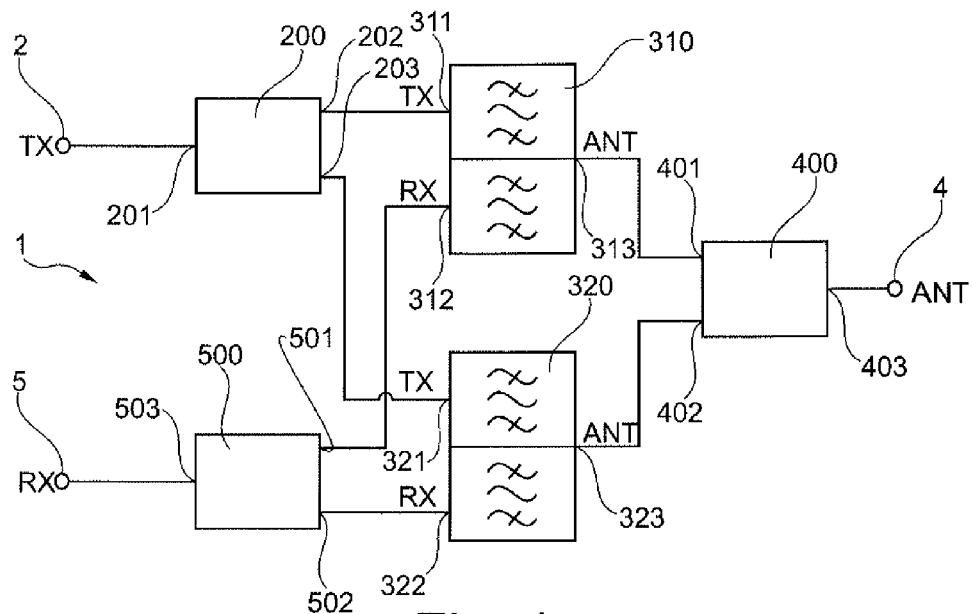
FIG. 1 shows a first aspect of the filter arrangement according to the present disclosure

FIG. 1 shows as an aspect of the present disclosure a duplex filter arrangement 1 for filtering a transmit signal TX which is received at a filter arrangement transmit input 2 and providing the filtered transmit signal at an antenna terminal 4. A receive signal RX, which is received at the antenna terminal 4, is filtered and the filtered receive signal is provided at a filter arrangement receive output 5. A plurality of the transmit signals TX together form a transmit band. A plurality of the receive signals RX together form a receive band. The transmit band and the receive band are distinct from each other, i.e. the receive signals RX do not have the same frequencies as the transmit signals TX.

The transmit signal TX is passed from the filter arrangement transmit input 2 to a first signal divider input 201 of a signal divider 200. The signal divider 200 splits the transmit signal TX received at the first divider input 201 into two signal portions which are provided at a first signal divider output 202 and a second signal divider output 203. The first signal divider output 202 is connected to a first transmit port 311 of a first duplex filter 310. The second signal divider output 203 is connected to a second transmit port 321 of a second duplex filter 320. While the transmit signal portion received at the first transmit port 311 of the first duplex filter 310 passes to a first antenna port 313 of the first duplex filter 310, signals outside of the transmit band are substantially suppressed. In the same manner while the transmit signal portion received at the second transmit port 321 of the second duplex filter 320 passes to a second antenna port 323 of the second duplex filter 320, signals outside of the transmit band are substantially suppressed.

The first antenna port 313 of the first duplex filter 310 is connected to a first divider/combiner port 401 of a signal divider/combiner 400. The second antenna port 323 of the second duplex-filter 320 is connected to a second divider/combiner port 402 of the signal divider/combiner 400. In the aspect of the present disclosure shown in FIG. 1 the signal divider/combiner 400 provides signal dividing capabilities as well as signal combining capabilities, depending on the direction of signal flow. Signals received at the first divider/combiner port 401 and the second divider/combiner port 402 are combined and provided at a third divider/combiner port 403.

In an inverse manner a signal received at the third signal/combiner port 403 is split into two signal portions which are provided at the first signal divider/combiner port 401 and the second signal divider/combiner port 412.

A receive signal RX received at the third divider/combiner port 403 is thus divided into a first receive signal portion provided at the first divider/combiner port 401 and a second receive signal portion provided at the second divider/combiner port 402. As the first divider/combiner port 401 is connected to the first antenna port 313, the first receive signal portion passes from the first antenna port 313 to a first receive port 312 of the first duplex filter 310, while signals outside of the receive band are substantially suppressed. As the second divider/combiner port 402 is connected to the second antenna port 323, the second receive signal portion passes from the second antenna port 323 to a second receive port 322 of the second duplex filter 320, while signals outside of the receive band are substantially suppressed. The first receive port 312 of the first duplex-filter 310 is connected to a first signal combiner input 501 of a signal combiner 500, while the second receive port 322 of the second duplex-filter 320 is connected to a second signal combiner input 502 of the signal combiner 500. The signal combiner 500 combines the signals received at the first signal combiner input 501 and the signal received at the second signal combiner input 502 and provides a combined signal at a signal combiner output 503.

In the aspect of the present disclosure of FIG. 1 the first duplex filter 310 and the second duplex filter 320 are, for example, film bulk acoustic resonator filter (FBAR). The FBARs are relatively cheap and small in size, but have poorer filter properties than bigger and more expensive filter elements. It is known that some signal portions of the transmit signal TX at the transmit port 311 will occur also at the receive port 312 due to crosstalk and/or other effects. The suppression ratio of the transmit signal TX to the receive signal RX is termed "TX-RX isolation". Values around 40 dB are typical for TX-RX isolation for the duplex FBAR. The TX-RX isolation properties of the filter arrangement of FIG. 1 can be improved by using the signal divider 200, the signal divider/combiner 400 and the signal combiner 500 which generate phase shifts in the output signals when dividing an input signal and shift phases of the input signals when combining the input signals. It will be appreciated that the first duplex filter 310 and the second duplex filter 320 could be surface acoustic wave (SAW) filters, bulk acoustic wave (BAW) filters, dielectric filters, including ceramic filters, metal cavity filters, etc.

Figure 2:
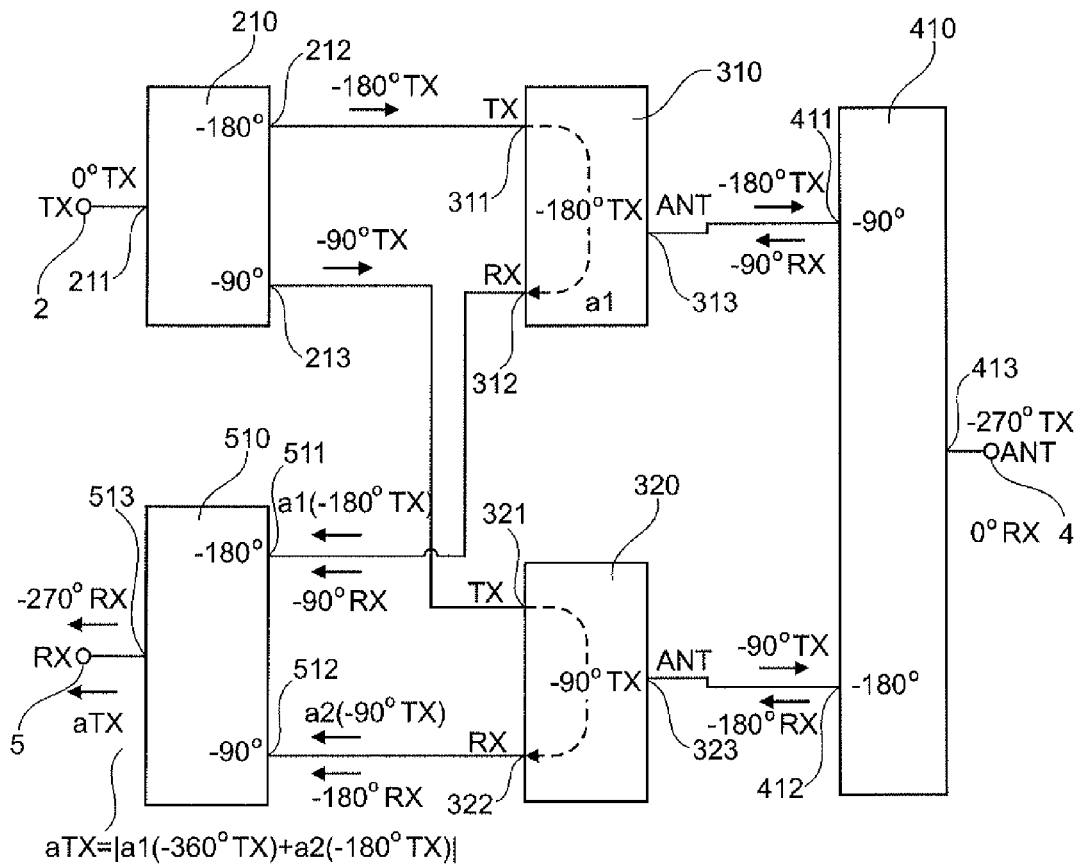
FIG. 2 shows a further aspect of the filter arrangement according to the present disclosure

FIG. 2 shows the same circuit arrangement as in FIG. 1 but with a phase relationship between the different signals. For each of the first signal combiner 210, the first combiner/divider 410 and the first signal combiner 510 a hybrid coupler has been chosen. The hybrid coupler splits an input signal into a first signal portion and a second signal portion which are 90° apart in phase. Effectively the first signal portion is retarded by $\lambda/4=90°$ and the second signal portion is retarded by $\lambda/2=180°$. A similar effect occurs in the other direction when a first signal and a second signal are combined. The output signal is a combination of the first signal, which is retarded by $\lambda/4=90°$, and the second signal, which is retarded by $\lambda/2=180°$.

We shall now discuss a regular signal flow through the duplex filter and then the signal flow of the undesired signals.

The transmit signal TX received at the first input 211 of the signal combiner 210 occurs at the first divider output 212 with a phase delay of 180° and passes from the first transmit port 311 of the first duplex filter 310 to the first antenna port 313 of the first duplex filter 310 without a phase change. Of the possible ports 411, 412 of the first divider/combiner 410 that may be chosen to be connected to the first antenna port 313 of the first duplex filter 310, the port 411 or 412 that adds 90° signal delay to the transmit signal TX has to be chosen. Thereby the total signal delay of the transmit signal TX that has passed through the first duplex filter 310 is 270° at the third divider/combiner port 413. In contrast hereto the transmit signal TX received at the first input 211 of the first signal combiner 210 occurs at the second divider output 213 with a phase delay of 90° and passes from the second transmit port 321 of the second duplex filter 320 to the second antenna port 323 of the second duplex filter 320 without a phase change. The second antenna port 323 of the second duplex filter 320 is connected to the remaining divider/combiner port 412 that adds 180° signal delay to the transmit signal TX at the third divider/combiner port 413. The total signal delay of the transmit signal TX that has passed the second duplex filter 320 is also 270°. In this manner, the first transmit signal portion that passes the first duplex filter 310 and the second transmit signal portion that passes the second duplex filter 320 are combined in-phase.

The first receive signal portion of the receive signal RX that passes from the third divider/combiner port 413 to the first combiner/divider port 411 of the combiner/divider 410 is retarded by 90°. The first receive signal portion passes the first duplex-filter 310 without phase change. While passing from the first signal combiner input 511 to the first signal combiner output 513 another phase delay of 180° is added to the first receive signal portion. The first receive signal portion occurs with a total phase delay of 270° at the first signal combiner output 513. The second receive signal portion of the receive signal RX that passes from the third divider/combiner port 413 to the second combiner/divider port 412 of the combiner/divider 410 is retarded by 180°. The second receive signal portion passes the second duplex filter 320 without phase change. While passing from the second signal combiner input 512 to the first signal combiner output 513 a phase delay of 90° is added to the second receive signal portion so that the second signal portion occurs also with a total phase delay of 270° at the first signal combiner output 513. In this manner the first receive signal portion and the second receive signal portion are combined in-phase.

When the first transmit signal portion passes the first duplex filter 310 from the first transmit port 311 to the first antenna port 313 a small first leakage signal a1TX leaks to the first receive port 312 of the first duplex filter 310. The first leakage signal a1TX is denoted in FIG. 2 as a factor a1. The first leakage signal a1TX is superimposed on the first receive signal portion as undesired noise. The phase delay of the first leakage signal a1TX is 180° compared to the transmit signal TX at the filter arrangement transmit input 2. The total signal delay after the first leakage signal a1TX has passed, together with the first receive signal portion, the first signal combiner 510 is 360°.

When the second transmit signal portion passes the second duplex filter 320 from the second transmit port 321 to the second antenna port 323 a small second leakage signal leaks to the second receive port 322 of the second duplex filter 320. The second leakage signal is denoted in FIG. 2 as a factor a2. The second leakage signal a2TX is superimposed on the second receive signal portion as undesired noise. The phase delay of the second leakage signal is 90° compared to the transmit signal at the filter arrangement transmit input 2. The total signal delay after the second leakage signal a2TX has passed together with the second receive signal portion the first signal combiner 510 is 180°. The transmit noise in the receive signal at the first signal combiner output is a combination of $a1*TX(360°+)+a2*TX(180°)$.

In the event that all of circuit elements have identical properties, the first leakage factor a1 and the second leakage factor a2 would be identical. The phase difference between the first leakage signal and the second leakage signal is 180°. Thus the first leakage signal and the second leakage signal would—in the ideal world—perfectly compensate each other. However, tolerances in the various circuit elements of the filter arrangement 1 vary the attenuation of the different signals and also the phase delays are not exactly 90° or 180°. The signal compensation of the first leakage signal and the second leakage signal do not therefore perfectly compensate each other. Simulations carried out by the inventors have shown the TX-RX isolation however, is improved at least by 15 dB to 20 dB.

Figure 3:
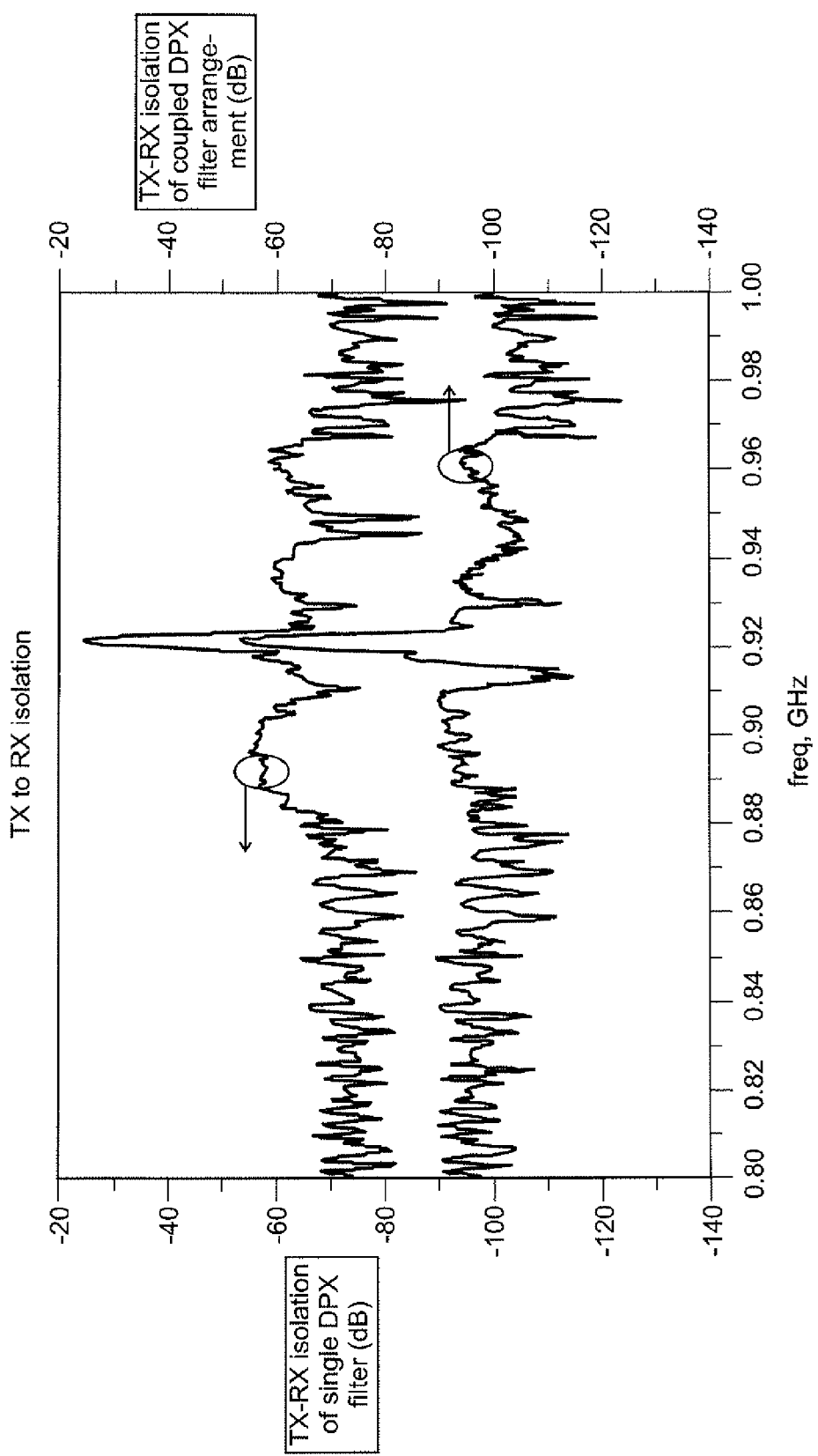
FIG. 3 shows the simulation results for a single FBAR duplex receiver compared to the filter arrangement of the present disclosure.

FIG. 3 shows an aspect of the simulation of the TX-RX isolation in which the upper line represents the TX-RX isolation of a single FBAR duplex filter and the lower line represents the TX-RX isolation of a filter arrangement with two FBAR duplex filters as described above. The TX-RX isolation for a single FBAR Filter (upper curve) is around −70 dB for frequencies from 800 MHz-915 MHz, and from 925 MHz-1 GHz. Using this FBAR filter in the filter arrangement described above, provided a good matching (lower than −20 dB reflection coefficient) at the ports 2, 4 and 5, an TX-RX isolation improvement of around 20 dB can be expected for the filter arrangement. The lower curve in FIG. 3 shows the simulation results of the filter arrangement with an improved TX-RX isolation of around 20 dB. In the simulation, measured data (realistic/non-ideal) were used for the FBAR Filters and the 90 degree couplers.

This filter arrangement 1 requires more real estate on the chip and more circuit elements. It is found, however, that the total amount of real estate used and the costs are still less than for a filter arrangement 1 using a single conventional ceramic filter of the prior art with comparable properties. The person skilled in the art will appreciate that a plurality of duplex filter elements may be used in parallel in the same manner.

Figure 4:
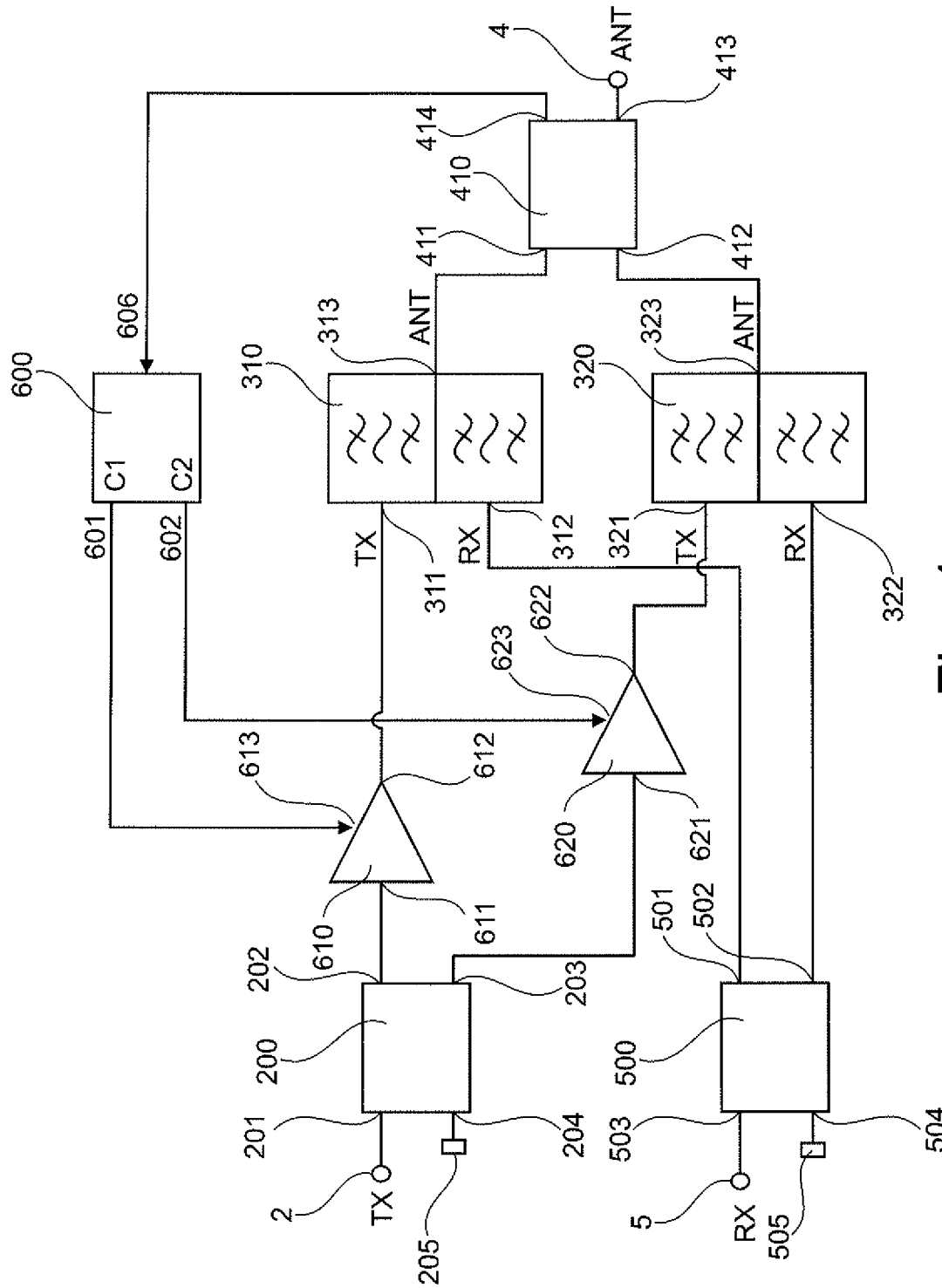
FIG. 4 shows yet another aspect of the filter arrangement according to the present disclosure

Another aspect of the present disclosure is depicted in FIG. 4. Like reference numerals are used for elements which are common to the aspects of the disclosure in FIGS. 1 and 2. The quadrature coupler 410 for splitting a signal into two signal portions or combining two signal portions into one signal include a fourth coupler terminal 414. Ideally the fourth coupler terminal 414 has no voltage applied to the fourth coupler terminal 414 and no current flows through the fourth coupler terminal 414. In reality, the circuit elements are imperfect and the fourth coupler terminal 414 of the quadrature coupler 400 is impedance matched with a 50Ω impedance 205, 505. In the present aspect of the present disclosure shown in FIG. 4 the voltage at the fourth coupler terminal 414 is used to control a gain and/or phase of at least one amplifier, in order to further improve the TX-RX isolation of a duplex-filter arrangement. In the aspect shown in FIG. 4 two amplifiers are shown as 613 and 633, as will be discussed later.

The duplex filter arrangement 1 of FIG. 4 filters the transmit signal TX, received at the filter arrangement transmit input 2 and provides the filtered transmit signal at the antenna terminal 4. The receive signal RX, received at the antenna terminal 4, is filtered and the filtered receive signal is provided at the filter arrangement receive output 5.

In the aspect of the disclosure presented in FIG. 4 the transmit signal TX is passed from the filter arrangement transmit input 2 to the first signal divider input 201 of the first signal divider 200. The first signal divider input 201 is identical to the signal divider input 209. The first signal divider 200 splits the transmit signal TX received at the first signal divider input 201 in two signal portions which are provided at a first signal divider output 202 and a second signal divider output 203. The first signal divider output 202 is connected to a first amplifier input 611 of a first amplifier 610. A first amplifier output 612 is connected to a first transmit port 311 of a first duplex filter 310.

The second signal divider output 203 is connected to a second amplifier input 621 of a second amplifier 620. A second amplifier output is connected to a second transmit port 321 of a second duplex filter 320. A signal received at the first transmit port 311 of the first duplex filter 310 passes to a first antenna port 313 of the first duplex filter 310. As discussed above, the signals outside the transmit band are substantially suppressed. In the same manner, while a signal received at the second transmit port 321 of the second duplex filter 320 passes to a second antenna port 323 of the second duplex filter 320, signals outside the transmit band are substantially suppressed.

The first antenna port 313 of the first duplex filter 310 is connected to a first divider/combiner port 411 of a signal divider/combiner 410. The second antenna port 323 of the second duplex filter 320 is connected to a second divider/combiner port 412 of the signal divider/combiner 410. In the aspect of the present disclosure the signal divider/combiner 410 provides signal dividing capabilities as well as signal combining capabilities, depending on the direction of the signal flow. The signals received at the first divider/combiner port 411 and the second divider/combiner port 412 are combined and provided at a third divider/combiner port 413. In an inverse manner the signal received at the third signal/combiner port 413 is divided in two signal portions which are provided at the first signal divider/combiner port 411 and the second signal divider/combiner port 412.

The receive signal RX received at the third divider/combiner port 413 is split into a first receive signal portion provided at the first divider/combiner port 411 and a second receive signal portion provided at the second divider/combiner port 412. The first divider/combiner port 401 is connected to the first antenna port 313. The first receive signal portion passes from the first antenna port 313 to a first receive port 312 of the first duplex filter 310, whilst signals outside the receive band are substantially suppressed. The second divider/combiner port 412 is connected to the second antenna port 323. The second receive signal portion passes from the second antenna port 323 to a second receive port 322 of the second duplex filter 320, while signals outside the receive band are substantially suppressed. The first receive port 312 of the first duplex filter 310 is connected to a first signal combiner input 501 of signal combiner 500. The second receive port 322 of the second duplex filter 320 is connected to a second signal combiner input 502 of the signal combiner 500. The signal combiner 500 combines the signals received at the first signal combiner input 501 and the signal received at the second signal combiner input 502 and provides a combined signal at a combiner output 503.

In the aspect of the present disclosure the first duplex filter 310 and the second duplex filter 320 are film bulk acoustic resonator filters (FBAR). The FBARs are relatively cheap and small in size but have poorer filter properties than bigger and more expensive filter elements. Portions of the transmit signal at the transmit port 311 will occur also at the receive port 312 due to crosstalk and/or other effects. The suppression ratio of the transmit signal in the receive signal is also termed "TX-RX isolation". Duplex FBAR values around 40 dB are typical for TX-RX isolation. The TX-RX isolation properties of the aspect of FIG. 4 can be improved by using the signal divider 200, the signal divider/combiner 400 and the signal combiner 500 which generate phase shifts in the output signals when dividing an input signal and shift phases of the input signals when combining the input signals.

Apart from the first amplifier 610 and the second amplifier 620 this duplex filter arrangement 1 of FIG. 4 compensates transmit signal leakages as described previously with respect to FIG. 2. The first amplifier 610 and the second amplifier 620 may be power amplifiers to level up the power of the transmit signal TX. In this aspect of the present disclosure the first amplifier 610 has a first control input 613 and the second amplifier 620 has a second control input 623 for controlling the gain of the first amplifier 610 and the second amplifier 620 and/or for shifting the phase of an amplified signal of the first amplifier 610 and the second amplifier 620.

In order to generate an appropriate first control signal C1 and an appropriate second control signal C2 an amplifier control device 600 provides a control input 606 which is connected to the fourth coupler terminal 414 of the first divider/combiner 410. The residual signal at the fourth coupler terminal 414 is sensed by the amplifier control device 600 and the first control signal C1 and the second control signal C2 are generated. In the event that the first amplifier 610 and the second amplifier 620 are primarily used as power amplifiers to amplify the transmit signal TX, the first control signal C1 and the second control signal C2 vary the gain and phase of the first amplifier 610 and the second amplifier 620, such that the total gain (measured at the antenna terminal) is kept substantially constant, but that the voltage level of the first transmit signal leaking from the first transmit port 311 to the first receive port 312 is equal to the level of the transmit signal that is leaking from the second transmit port 321 of the second duplex-filter 320 to the second receive port 322 of the second duplex filter 320. The better the amplifier control device 600 is capable of balancing the first leaking signal and the second leaking signal the better is the compensation of the first leaking transmit signal and the second transmit leaking signal when the first leaking transmit signal and the second transmit leaking signal are combined, 180° apart in phase, in the signal combiner 510.

Figure 5A:
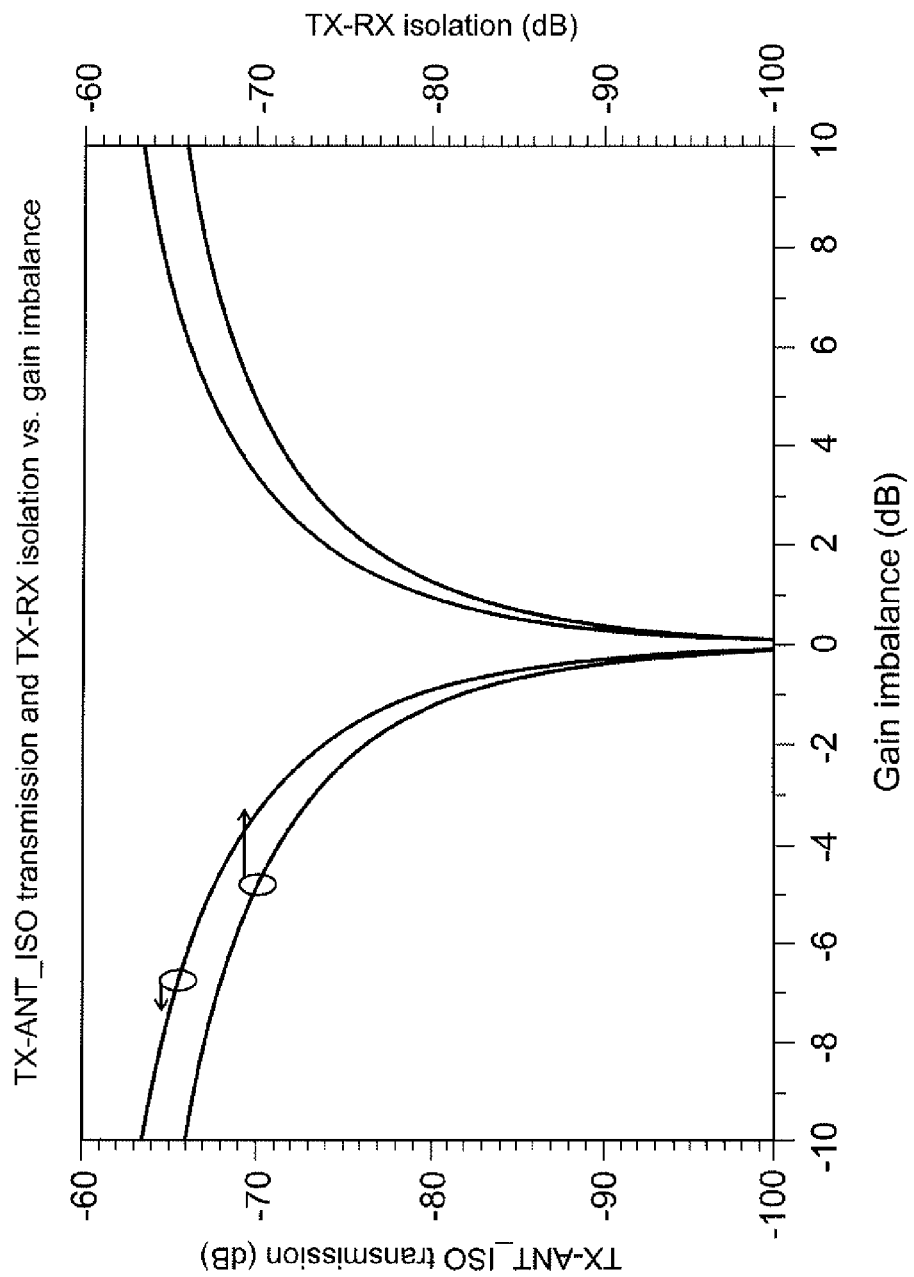
FIG. 5A shows the simulation results of TX-RX isolation and TX-Antenna transmission against gain imbalance for one aspect of the invention.

FIG. 5A shows simulation results of the TX-RX isolation and TX-antenna transmission against gain imbalance. FIG. 5A indicates that the TX-RX isolation a TX-antenna transmission will be substantially improved by adjusting the gain imbalance.

Figure 5B:
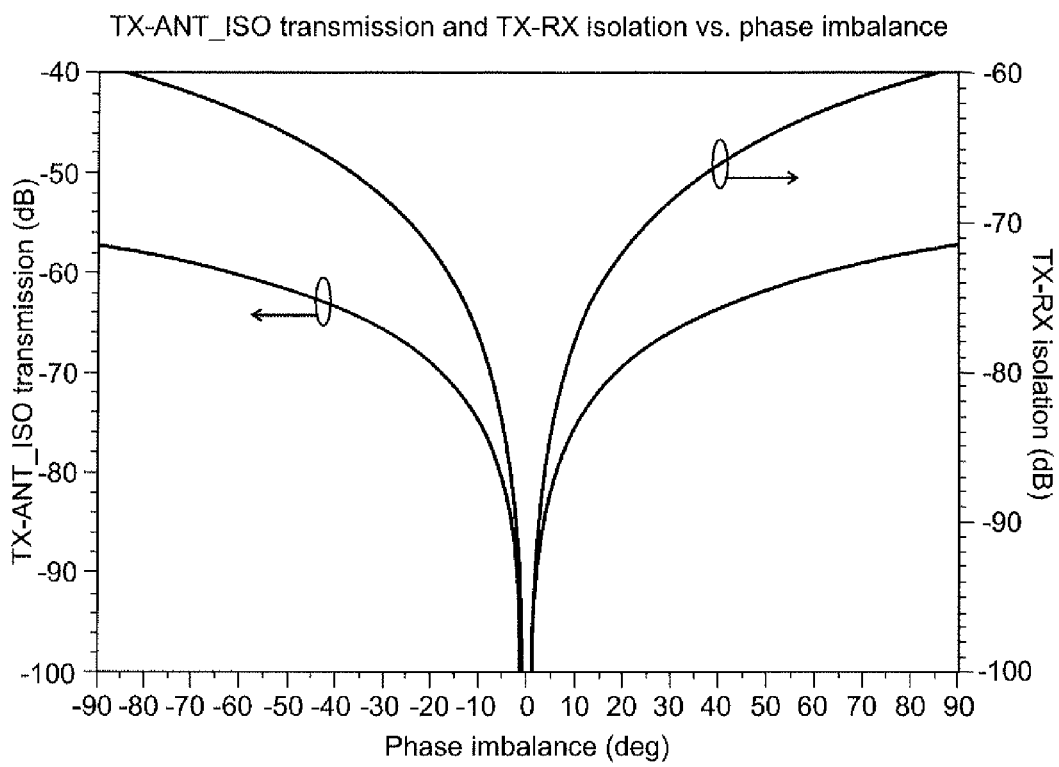
FIG. 5B shows the simulation results of TX-RX isolation and TX-Antenna transmission against phase imbalance for one aspect of the invention.

Similarly FIG. 5B shows the TX-RX isolation of an TX-antenna transmission against phase imbalance which shows a similar substantial improvement and demonstrates the use of the first amplifier 610 and the second amplifier 620.

Figure 6:
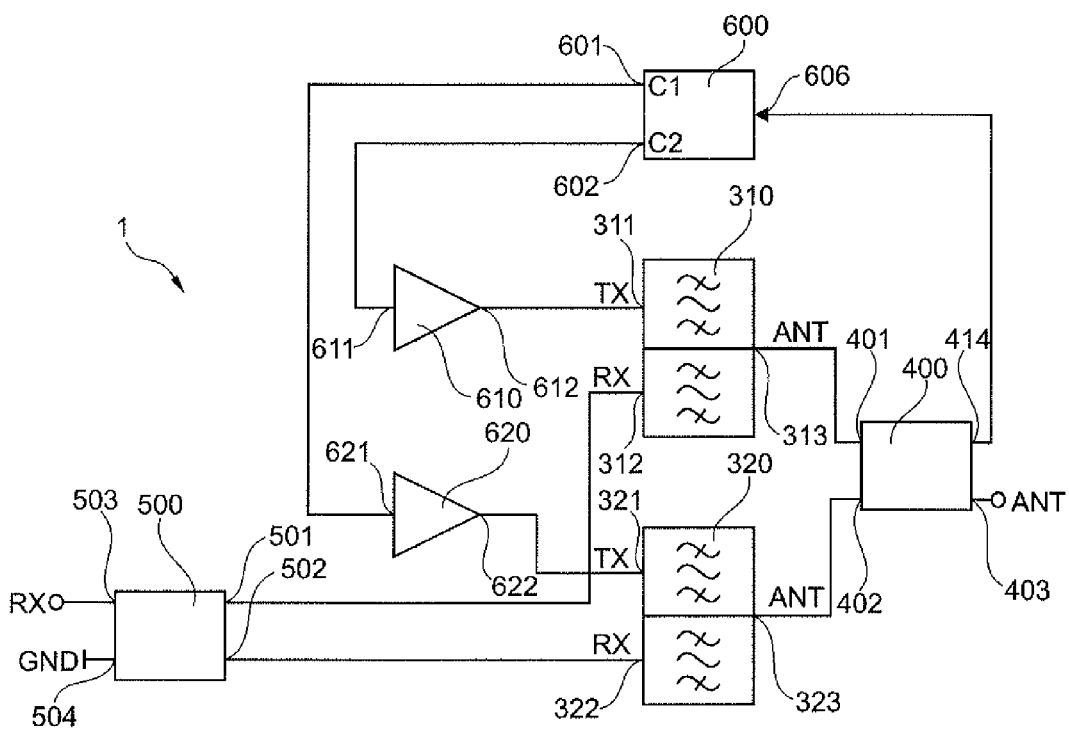
FIG. 6 shows yet another aspect of the filter arrangement according to the present disclosure

Another aspect of the present disclosure is shown in FIG. 6. The filter arrangement 1 of FIG. 6 is similar to the aspect of the present disclosure that is illustrated in FIG. 4, except that the filter arrangement 1 has no signal divider for splitting a transmit signal TX into a first transmit signal portion and into a second transmit signal portion. Further instead of being connected to a first amplifier control input 613, the first control output 601 of the amplifier control device 600 is connected directly to the first amplifier input 611. Similarly instead of being connected to a second amplifier control input 623, the second control output 602 of the amplifier control device 600 is connected directly to the second amplifier input 621.

A transmit signal TX received at a transmit signal input 2 is passed to a control device transmit signal input 603 of the amplifier control device 600. In the amplifier control device 600 a first transmit signal portion is derived from the transmit signal TX by electronically applying substantially a 180° phase delay to the transmit signal TX. A second transmit signal portion is derived from the transmit signal TX by electronically applying substantially a 90° phase delay to the transmit signal TX. The electronically generated phase shift of the first transmit signal portion and the second transmit signal portion are provided by the amplifier control device in order to compensate the phase shift that will be applied by the signal divider/combiner 400 to the first transmitter signal portion and the second transmitter signal portion. As the amplifier control device 600 has to adopt the gain/phase of the first transmitter signal portion and the second transmitter signal portion it can be used at the same time to generate the phase delay of the first transmit portion signal and the second transmit portion signal so that a signal splitter, like the one used in FIG. 4 becomes obsolete.

In this aspect of the present disclosure the two transmit signal portions (the first transmit signal portion TX1 and the second transmit signal portion TX2) are generated in the controller 600 and sent respectively to the first amplifier 610 and the second amplifier 620, but with different phase and gain. The output of the fourth coupler terminal 414 can be sensed by the amplifier control device 600 to generate an appropriate gain and/or phase shift of the first transmit signal portion TX1 and an appropriate gain/phase shift of the second transmit signal portion TX2. The first amplifier 610 amplifies the first transmit signal portion TX1 and generates the first output signal of the first amplifier 610 which is passed to the first transmit port 311 of the first duplex filter element 310. The second amplifier 620 amplifies the second transmit signal portion TX2 and passes to the second transmit port 321 of the second duple-filter element 320. The phase and gain of the individual transmit signal portions TX1 and TX2 in the first amplifier 610 and the second amplifier 620 are adjusted to minimize the signal power measured at the fourth splitter/combiner port 414. The controller 600 adjusts gain and phase of the individual transmit signals TX1 and TX2 adaptively.

The present disclosure further relates to a computer program product embedded on a computer readable medium. The computer program product comprises executable instructions for the manufacture of the filter arrangement of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. Thus, the present invention should not be limited by any of the above-described exemplary embodiments, but should be defined only in accordance with the following claims and their equivalents.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer usable medium such as semiconductor, magnetic disk, or optical disc (e.g., CO-ROM, OVO-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A filter arrangement for filtering a radio transmit signal and a receive signal comprising:
  a first duplex filter, the first duplex filter comprising a first transmitter port, a first receiver port, and a first antenna port;
  a second duplex filter, the second duplex filter comprising a second transmitter port, a second receiver port, and a second antenna port;
  a transmitter signal splitting device for splitting a transmit input signal into a first transmitter signal portion and a second transmitter signal portion;
  a signal divider/combiner with a first signal divider/combiner port, connected to the first antenna port of the first duplex filter, and with a second signal divider/combiner port, connected to the second antenna port of the second duplex filter, the signal divider/combiner combining a first filtered transmit portion signal and a second filtered transmit portion signal into a single filtered transmit signal, which is provided at a third signal divider/combiner port of the signal divider/combiner, and for splitting the radio receive signal received at the third signal divider/combiner port into a first receive signal portion and a second receive signal portion, the first receive signal portion being provided at the first signal divider/combiner port and the second receive signal portion being provided at the second signal divider/combiner port;
  a signal combiner with a first signal combiner input port connected to the first receiver port of the first duplex filter, and with a second signal combiner port connected to the second receiver port of the second duplex filter, for combining a first filtered receive signal portion and a second filtered receive signal portion into a single filtered receive signal, which is provided at a third port of the signal combiner;
  at least a first amplifier with at least a first amplifier output connected to the first transmitter port of the first duplex filter;
  a compensation controller providing at least a first amplifier control signal to control at least one of an amplifying gain or a phase shift, wherein the compensation controller generates the first amplifier control signal in dependence of a signal provided at a fourth divider/combiner port of the signal divider/combiner.

2. The filter arrangement according to claim 1 further comprising a second amplifier having a second amplifier output connected to the second transmitter port of the second duplex filter.

3. The filter arrangement according to claim 2 wherein the transmitter signal splitting device is a signal divider providing the first transmitter signal portion and the second transmitter signal portion, the first transmitter signal portion being passed to a first amplifier input of the first amplifier, and the second transmitter signal portion being passed to a second amplifier input of the second amplifier.

4. The filter arrangement according to claim 2, wherein the first amplifier control signal of the compensation controller is passed to a first amplifier input of the first amplifier and a second amplifier control signal of the compensation controller is passed to a second amplifier input of the second amplifier.

5. The filter arrangement according to claim 2 wherein the transmitter signal splitting device is incorporated in the compensation controller and the first transmit signal portion is derived from the transmitter signal by electronically applying a 180° phase delay to the transmitter signal and the second transmitter signal portion is derived from the transmitter signal by electronically applying a 90° phase delay to the transmitter signal.

6. The filter arrangement according to claim 1 wherein at least one of the signal combiner, the transmitter signal splitting device or the signal divider/combiner is a 90° coupler.

7. The filter arrangement according to claim 1 wherein at least one of the first duplex filter and the second duplex filter is at least one of a film bulk acoustic resonator filter (FBAR), a surface acoustic wave device, a bulk acoustic wave device, a ceramic filter and a cavity filter.

8. A method of manufacturing a filter arrangement for filtering a radio signal comprising:
  connecting a first signal divider output of a signal divider to a first transmitter port of a first duplex filter;
  connecting a second signal divider output to a second transmitter port of a second duplex filter;
  connecting a first antenna port of the first duplex filter to a first signal divider/combiner port of a signal divider/combiner;

connecting a second antenna port of the second duplex filter to a second signal divider/combiner port of the signal divider/combiner/divider;

connecting a first signal combiner port of a signal combiner to a first receive port of the first duplex filter;

connecting a second signal combiner port of the signal combiner to a second receive port of the second duplex filter;

connecting at least a first amplifier with at least a first amplifier output to the first transmitter port of the first duplex filter;

connecting a compensation controller providing at least a first amplifier control signal to control at least one of an amplifying gain or a phase shift, wherein the compensation controller generates the first amplifier control signal in dependence of a signal provided at a fourth divider/combiner port of the signal divider/combiner.

9. A computer program product comprising a non-transitory computer-usable medium having control logic stored therein for causing a computer to manufacture a filter arrangement for filtering a radio signal comprising:

a first duplex filter, the first duplex filter comprising a first transmitter ports, a first receiver port, and a first antenna port;

a second duplex filter, the second duplex filter comprising a second transmitter port, a second receiver port, and a second antenna port;

a signal divider for splitting a transmit input signal into a first transmitter signal portion and a second transmitter signal portion, the first transmitter signal portion being passed to the first transmitter port of the first duplex filter, and the second signal transmitter portion being passed to the second transmitter port of the second duplex filter;

a signal divider/combiner with a first signal divider/combiner port connected to the first antenna port of the first duplex filter, and a second signal divider/combiner port connected to the second antenna port of the second duplex filter, the signal divider/combiner combining a first filtered transmit portion signal and a second filtered transmit portion signal into a single filtered transmit signal, which is provided at a third signal divider/combiner port of the signal divider/combiner, and for splitting a radio receive signal received at the third signal divider/combiner port into a first receive signal portion and a second receive signal portion, the first receive signal portion being provided at the first signal divider/combiner port and the second receive signal portion being provided at the second signal divider/combiner port;

a signal combiner with a first signal combiner port connected to the first receiver port of the first duplex filter, and with a second signal combiner port of the second duplex filter connected to the second receiver port of the second duplex filter, the signal combiner combining a first filtered receive signal portion and a second filtered receive signal portion into a single filtered receive signal, which is provided at a third signal combiner port of the signal combiner;

at least a first amplifier with at least a first amplifier output connected to the first transmitter port of the first duplex filter;

a compensation controller providing at least a first amplifier control signal to control at least one of an amplifying gain or a phase shift, wherein the compensation controller generates the first amplifier control signal in dependence of a signal provided at a fourth divider/combiner port of the signal divider/combiner.

* * * * *

UNITED STATES PATENT AND TRADEMARK OFFICE
CERTIFICATE OF CORRECTION

| | |
|---|---|
| PATENT NO. | : 8,723,619 B2 |
| APPLICATION NO. | : 13/044026 |
| DATED | : May 13, 2014 |
| INVENTOR(S) | : Holger Weib |

It is certified that error appears in the above-identified patent and that said Letters Patent is hereby corrected as shown below:

In the Claims,

Col. 13, Claim 8, line 3, divider/combiner/divider;

should read -- divider/combiner; --

Signed and Sealed this
Eighth Day of July, 2014

Michelle K. Lee
*Deputy Director of the United States Patent and Trademark Office*